United States Patent
Park et al.

(10) Patent No.: US 7,008,755 B2
(45) Date of Patent: Mar. 7, 2006

(54) METHOD FOR FORMING A PLANARIZED LAYER OF A SEMICONDUCTOR DEVICE

(75) Inventors: Ki-Jong Park, Yongin-si (KR); In-Seak Hwang, Suwon-si (KR); Tae-Won Kim, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 214 days.

(21) Appl. No.: 10/464,645

(22) Filed: Jun. 19, 2003

(65) Prior Publication Data

US 2004/0005518 A1 Jan. 8, 2004

(30) Foreign Application Priority Data

Jul. 6, 2002 (KR) ................................ 2002-39159

(51) Int. Cl.
*G03F 7/00* (2006.01)
*G03F 7/36* (2006.01)

(52) U.S. Cl. ...................... 430/314; 430/313; 430/317; 430/319; 430/328; 430/330

(58) Field of Classification Search ................ 430/313, 430/314, 317, 319, 328, 330
See application file for complete search history.

(56) References Cited

U.S. PATENT DOCUMENTS 5,872,060 A * 2/1999 Ashigaki et al. ............ 438/697
2003/0186170 A1 * 10/2003 Yamashita ................... 430/311

FOREIGN PATENT DOCUMENTS

| JP | 10-284702 | 10/1998 |
|---|---|---|
| KR | 1997-0052834 | 7/1997 |
| KR | 2001-0086625 | 9/2001 |
| KR | 2002-0011814 | 2/2002 |

* cited by examiner

*Primary Examiner*—Nicole Barreca
(74) *Attorney, Agent, or Firm*—Lee & Morse, P.C.

(57) ABSTRACT

In a method for forming a planarized layer on a semiconductor device having concave and convex structures, a dielectric film is formed on a semiconductor substrate; a photoresist pattern is formed to have a thickness on a portion of the dielectric film other than a convex portion greater than h/n (h and n are real numbers of one or more) to remove the convex portion of the dielectric film by a depth of approximately h. The photoresist pattern is re-flowed to have a thickness below h/n at a portion from an edge of the convex portion to a slant portion of the dielectric film. The dielectric film is etched using an etchant having a selectivity of 1:n between the photoresist pattern and the dielectric film. An edge of the photoresist pattern is made thin by re-flowing thereby minimizing a pillar, hence allowing simple, fast, planarization of the dielectric film.

18 Claims, 7 Drawing Sheets

METHOD FOR FORMING A PLANARIZED LAYER OF A SEMICONDUCTOR DEVICE

BACKGROUND OF THE INVENTION

1. Field of the Invention

The present invention relates to a method for forming a planarized layer of a semiconductor device. More particularly, the present invention relates to a method for forming a planarized layer of a semiconductor device, which can effectively planarize an insulation film at an edge portion of an underlying pattern corresponding to a high step when the insulation film is formed to cover the underlying pattern having a predetermined height.

2. Description of the Related Art

As semiconductor devices become more highly integrated, the area of a unit cell of the semiconductor device becomes smaller. Capacitors having a cylindrical shape are therefore often employed in order to ensure the delivery of required capacitance in the smaller area. To increase the capacitance of the capacitor, the height of the capacitor is made higher, thereby generating a high step between the cell and the peripheral regions of a semiconductor substrate.

Because the step formed between the cell and the peripheral regions is high, a metal bridge or a metal stringer may remain in a successive metal process, causing a failure of metal wiring in the semiconductor device. In addition, a sufficient processing margin for a photolithography process cannot be ensured at the boundary between the cell and the peripheral regions where the step is positioned. As a result, various problems may arise in designing and manufacturing the semiconductor device.

To reduce the slope of the boundary between the cell and the peripheral regions, after an insulation film is coated on the semiconductor substrate, the coated insulation film is generally thermally treated to re-flow the insulation film, thereby reducing the slope of the boundary. However, only the slope of the boundary where the step is positioned decreases, the absolute step of the insulation film between the cell and the peripheral regions does not decrease. Therefore, re-flowing the insulation film is not sufficient to reduce the step between the cell and the peripheral regions when the step is high enough.

To overcome the above-mentioned problem, a chemical-mechanical polishing (CMP) process has been developed to remove a portion of an insulation film in a cell region having a height relatively higher than another portion of the insulation film in a peripheral region. The CMP process is intended to reduce the height of the portion of the insulation film in the cell region to make it equal to the height of the portion of the insulation film in the peripheral region. Although a CMP process can remove the step between the cell and the peripheral regions, this process takes a long time because the portion of the insulation film in the cell area has a much larger area than the portion of the insulation film in the peripheral region.

Therefore, to effectively remove a global step by a CMP process, several methods have been proposed in which an insulation film enclosed within a pillar remaining at a boundary between a cell region and a peripheral region is primarily removed by a predetermined depth through a photolithography and etching process prior to removal of the pillar by the CMP process. As a result, the amount of time required for the CMP process to planarize the insulation film may be reduced.

However, a better method is still needed to effectively remove a global step between a cell region and a peripheral region of a semiconductor device.

SUMMARY OF THE INVENTION

It is a feature of an embodiment of the present invention to provide a method for forming a planarized layer, which can effectively minimize the size of a remaining pillar by adjusting a thickness of a photoresist pattern and by re-flowing the photoresist pattern.

It is another feature of an embodiment of the present invention to provide a method for forming a planarized layer, which can greatly reduce the time requirements for a CMP process by minimizing the size of the remaining pillar.

It is still another feature of an embodiment of the present invention to provide a method for forming a planarized layer, in which an insulation film may be planarized without a CMP process.

A method for forming a planarized layer on a semiconductor substrate having concave and convex structures includes forming an interlayer dielectric film on the semiconductor substrate wherein the interlayer dielectric film has concave and convex portions in accordance with the concave and convex structures of the semiconductor substrate, forming a photoresist pattern on the interlayer dielectric film wherein a portion of the photoresist pattern on the interlayer dielectric film other than the convex portion of the interlayer dielectric film has a thickness of greater than h/n, where h and n are real numbers of one or more, in order to remove the convex portion of the interlayer dielectric film by a depth of approximately h, re-flowing the photoresist pattern so that the photoresist pattern formed from an edge of the convex portion of the interlayer dielectric film to a slant portion of the interlayer dielectric film between the convex portion and the concave portion has a thickness of below h/n, and etching the interlayer dielectric film by a depth of approximately h using an etchant having an etching selectivity of 1:n between the photoresist pattern and the interlayer dielectric film.

The interlayer dielectric film preferably includes BPSG, TEOS, TOSZ or a composite layer thereof. The photoresist pattern may be re-flowed by a photo apparatus or an etching apparatus. The interlayer dielectric film preferably has a thickness of approximately 5,000 to 30,000 Å.

The process may further include removing the photoresist pattern after etching the interlayer dielectric film, and removing a pillar of the interlayer dielectric film remaining at the slant portion of the interlayer dielectric film in order to planarize a surface of the interlayer dielectric film. The pillar is preferably removed by a chemical-mechanical polishing process, a wet etching process or an etch-back process. A supplemental film may be formed on the interlayer dielectric film after removing the pillar, and may include a material identical to that of the interlayer dielectric film. The interlayer dielectric film is preferably anisotropically etched.

According to another feature of an embodiment of the present invention, there is provided a method for forming a planarized layer of a semiconductor device formed on a semiconductor substrate including a cell region and a peripheral region wherein the semiconductor substrate includes a capacitor pattern in the cell region having a height greater than a height of the peripheral region, including forming an insulation film on the semiconductor substrate having a convex portion and a concave portion, with a slant portion between the convex portion and the concave portion, forming a photoresist pattern on the insulation film wherein a portion of the photoresist pattern in the cell region and the peripheral region other than on the convex portion of the insulation film has a thickness greater than h/n, where h and n are real numbers of one or more, in order to remove the convex portion of the insulation film by a depth of approximately h, re-flowing the photoresist pattern so that the photoresist pattern formed from an edge of the convex portion of the insulation film to the slant portion of the insulation film between the convex portion and the concave portion of the insulation film has a thickness less than h/n, and etching the insulation film by a depth of approximately h using an etchant having an etching selectivity of 1:n between the photoresist pattern and the insulation film.

The insulation film preferably includes BPSG, TEOS, TOSZ or a composite layer including at least two of BPSG, TEOS and TOSZ. The photoresist pattern may be re-flowed using a photo apparatus or an etching apparatus. The insulation film preferably has a thickness of approximately 5,000 to 30,000 Å.

The method may further include removing the photoresist pattern after etching the insulation film, and removing a pillar of the insulation film remaining at the slant portion of the insulation film in order to planarize a surface of the insulation film. The pillar is preferably removed by a chemical-mechanical polishing process, a wet etching process or an etch-back process. An additional insulation film may be formed on the insulation film after removing the pillar, and may include a material identical to that of the insulation film. Also, the insulation film is preferably anisotropically etched.

When the interlayer dielectric film is anisotropically etched, because the photoresist pattern positioned at the slant portion is removed before the end point of the etching process, the underlying interlayer dielectric film is removed together so that the size of the remaining pillar at the slant portion can be minimized or the remaining pillar can be completely removed.

The photoresist pattern is preferably thin in order to accomplish the effective re-flowing of the photoresist pattern because the minimum thickness of the photoresist pattern decreases in accordance with the augmentation of the etching selectivity of the etchant.

The photoresist pattern may be re-flowed using a photo apparatus or an etching apparatus. When the photoresist pattern is re-flowed using the photo apparatus, the photoresist pattern is re-flowed after the photoresist pattern is exposed and developed. When the photoresist pattern is re-flowed using the etching apparatus, the semiconductor substrate including the photoresist pattern is heat-treated in the heating chamber of the etching apparatus such that the photoresist pattern is re-flowed.

In the present invention, the photoresist pattern is removed after etching the interlayer dielectric film, and then the pillar remaining at the slant portion of the interlayer dielectric film is removed in order to planarize a surface of the interlayer dielectric film. At that time, the pillar is removed by a chemical-mechanical polishing process, a wet etching process or an etch back process. When the pillar is removed by the wet etching process, a supplemental film is preferably formed on the interlayer dielectric film in order to maintain the height of the interlayer dielectric film, because the interlayer dielectric film is partially removed with the pillar. In this case, the supplemental film includes a material identical to that of the interlayer dielectric film.

When the semiconductor device is a memory device, the interlayer dielectric film becomes an insulation film, and the concave and the convex portions of the semiconductor substrate correspond to a cell region and a peripheral region, respectively.

According to the present invention, because the portion of a photoresist pattern adjacent to the edge may have a reduced thickness by re-flowing the photoresist pattern, a pillar formed during the etching process can be effectively removed so that the interlayer dielectric film can be simply and easily planarized, while at the same time, the amount of time required for planarizing the interlayer dielectric film is reduced.

BRIEF DESCRIPTION OF THE DRAWINGS

The above features and advantages of the present invention will become more apparent to those of ordinary skill in the art by describing in detail preferred embodiments thereof with reference to the attached drawings in which.

DETAILED DESCRIPTION OF THE INVENTION

Figure 1:
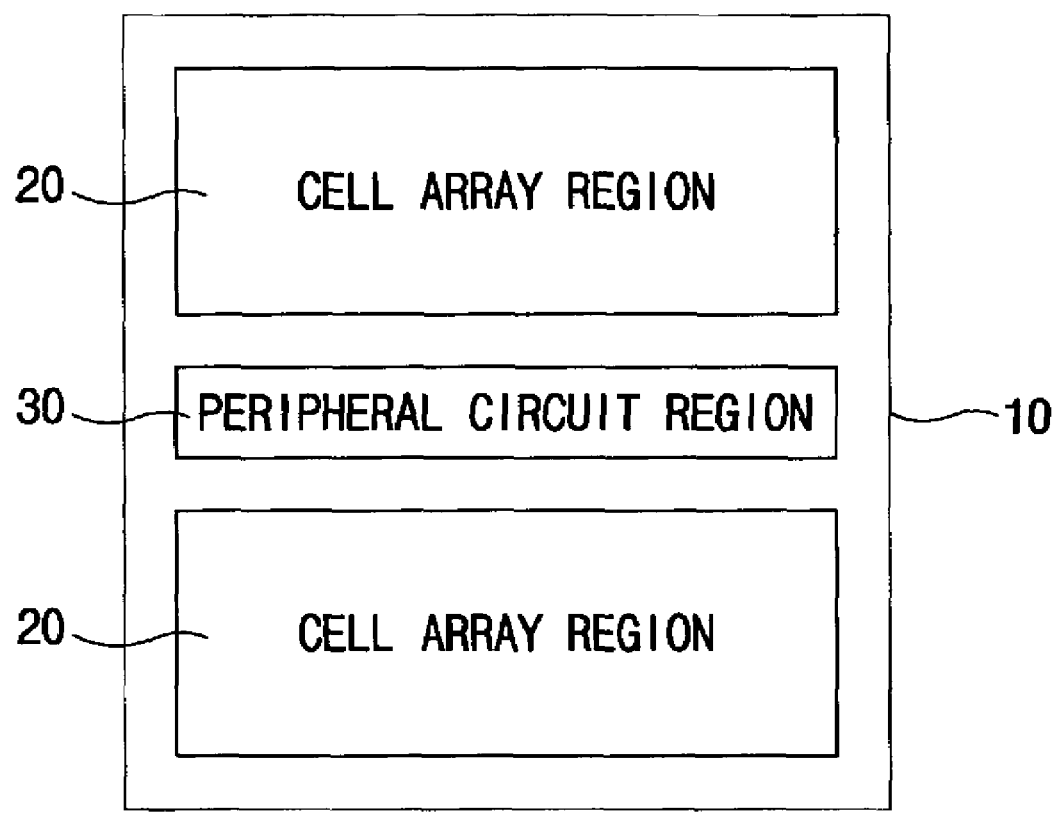
FIG. 1 illustrates a schematic plane view of a layout of a semiconductor device according to the present invention.

Korean Patent Application No. 2002-39159, filed on Jul. 6, 2002, and entitled: "Method For Forming A Planarized Layer Of A Semiconductor Device," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

FIG. 1 illustrates a schematic plane view of a layout of a semiconductor device according to the present invention.

Referring to FIG. 1, a memory device such as a DRAM device has a cell array region 20 and a peripheral circuit region 30 on a chip 10.

In the cell array region 20, cell devices are largely integrated with high integration density in order to store more data in a limited space. Because the cell devices are highly integrated in the cell region, a capacitor formed in the cell region has a high height as compared to the height of the area of the peripheral region. That is, the capacitor has a high aspect ratio to ensure sufficient capacitance for storing data in accordance with the minimized area of the cell region.

Figure 2:
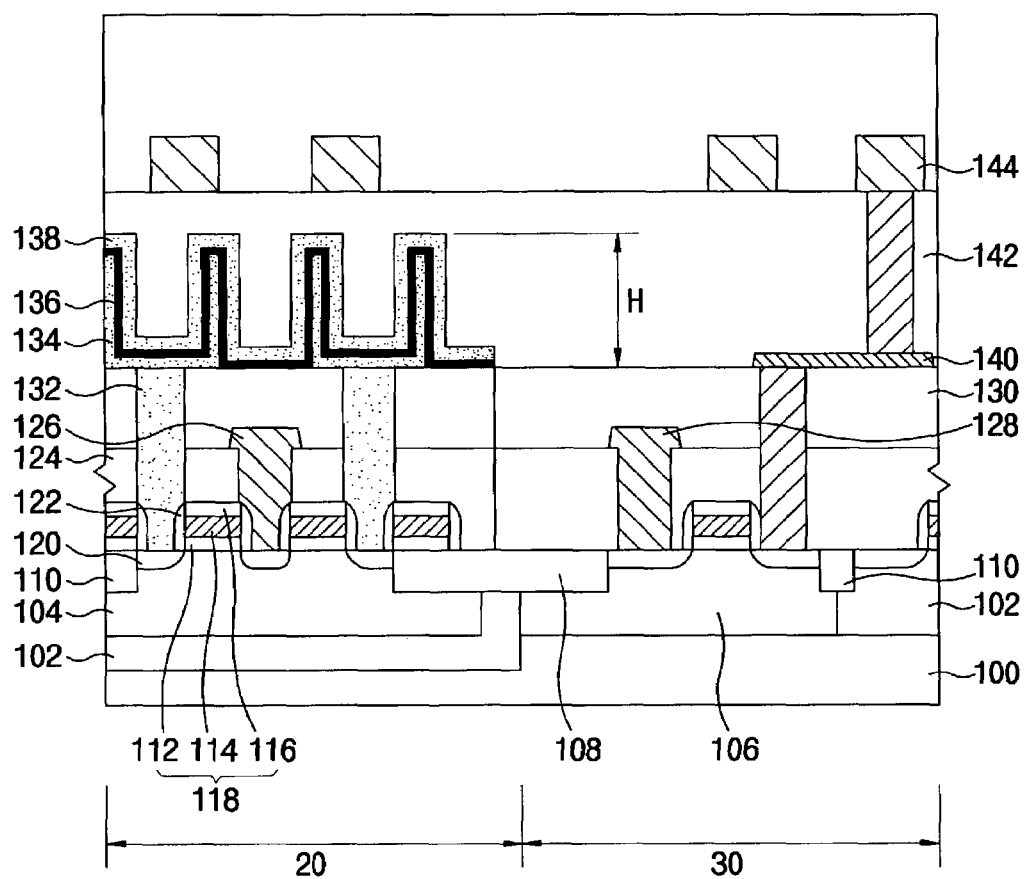
FIG. 2 illustrates a cross-sectional view showing a cell array region and a peripheral circuit region of the semiconductor device in FIG. 1.

FIG. 2 illustrates a cross-sectional view showing a cell array region and a peripheral circuit region of the semiconductor device shown in FIG. 1.

Referring to FIG. 2, an isolation region 110 is formed on a P-type semiconductor substrate 100 by a trench isolation process so that the semiconductor substrate 100 is divided into the cell array region 20 and the peripheral circuit region 30.

After an N well 102 is formed in the cell array region 20, a P well 104 is formed in the N well 102 through an ion implantation processes. At this time, a P well 106 and an N well 108 are also formed in the peripheral circuit region 30.

After a gate oxide film 112, a gate electrode 114, and a capping film 116 are successively formed in the cell array region 20, the films 112, 114 and 116 are patterned to form patterns 118 using a photolithography process. The patterns 118 serve as gate electrodes in an active region of the substrate 100, and also serve as a word line in an isolation region.

Impurity regions 120 are formed, via an ion implanting process, at the surface portion of the semiconductor substrate 100 using the patterns 118 in the cell array region 20 as implanting masks. The impurity regions 120 serve as source and drain regions of cell transistors. Spacers 122, preferably including nitride, are formed on sidewalls of the patterns 118, respectively.

An N-type transistor and a P-type transistor are formed in the peripheral circuit region 30 by a same process as that described above for forming transistors in the cell region 20.

A first interlayer dielectric film 124 is formed on the semiconductor substrate 100 having the transistors formed thereon, and then the first interlayer dielectric film 124 is planarized using a chemical-mechanical polishing (CMP) process.

Contact holes are formed through the first interlayer dielectric film 124 using a photolithography process. After a conductive material is coated on the first interlayer dielectric film 124, the conductive material is patterned to form a bit line 126 and a wiring 128 by a photolithography process.

After a second interlayer dielectric film 130 is formed on the first interlayer dielectric film 124, on the bit line 126 and on the wiring 128, the second interlayer dielectric film 130 is planarized using a CMP process.

Buried contact holes are formed through the second interlayer dielectric film 130 in the cell array region 20 using a photolithography process, and then buried contact plugs 132 are formed in the buried contact holes by filling the buried contact holes with polysilicon.

Bottom electrodes 134 having cylindrical shapes are formed on the second interlayer dielectric film 130 in the cell array region 20 to make contact with the buried contact plugs 132. After dielectric films 136 are coated on the bottom electrodes 134, top electrodes 138 are formed on the dielectric films 136, thereby completing cell capacitors in the cell array region 20. Meanwhile, a wiring 140 is formed in the peripheral circuit region 30.

Thus, the height of the cell array region 20 is relatively greater than the height of the peripheral circuit region 30, and a step having a height H is formed between the cell array region 20 and the peripheral circuit region 30. The step having the height H may limit the processing margin of the photolithography process for forming a via-hole considering a successive process for forming a metal wiring. Also, the relative height H of the step may cause a failure of the semiconductor device because a short or a stringer may occur in the metal wiring.

Therefore, a planarization process is required in order to reduce or eliminate the step between the cell array region 20 and the peripheral circuit region 30. A CMP process is generally employed for planarizing the cell array region 20 and the peripheral circuit region 30.

A third interlayer dielectric film 142 having a thickness of approximately 5,000 to 30,000 Å is formed over the semiconductor substrate 100 to cover the cell capacitors and the wiring 140. The third interlayer dielectric film 142 preferably includes BPSG, TEOS, TOSZ, or a composite layer having at least two layers of BPSG, TEOS and TOSZ.

After the third interlayer dielectric film 142 is planarized using a CMP process, a metal wiring 144 is formed on the third interlayer dielectric film 142. In this case, the time required for planarizing the third interlayer dielectric film 142 may increase because the CMP process is performed concerning the cell array region, which includes a greater part of the chip area than the peripheral circuit region 30.

Therefore, a cell open process has been introduced to remove a portion of the third interlayer dielectric film 142 covering the cell array region 20 by etching the third interlayer dielectric film 142 prior to performing the CMP process.

According to the present invention, an improved cell open process is provided to reduce the amount of time required for the CMP process, or to eliminate the need to perform the CMP process entirely.

FIGS. 3 to 11 illustrate cross-sectional views of a semiconductor device for showing a method for forming a planarized layer of a semiconductor device according to an embodiment of the present invention.

Figure 3:
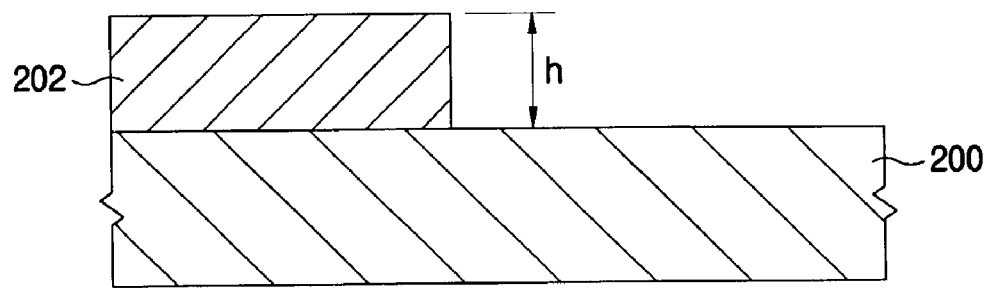
FIGS. 3 to 11 illustrate cross-sectional views of a semiconductor device showing a method for forming a planarized layer of a semiconductor device according to an embodiment of the present invention.

Referring to FIG. 3, a pattern 202 is formed on a semiconductor substrate 200 so that the pattern 202 has a predetermined height (h) and has a wide area on the semiconductor substrate 200. At that time, an underlying structure is formed on the surface of the semiconductor substrate 200. The underlying structure may include a transistor, a bit line, a wiring, an interlayer dielectric film, etc. The pattern 202 corresponds to a plurality of cell capacitors formed in a cell array region of a semiconductor substrate.

Figure 4:
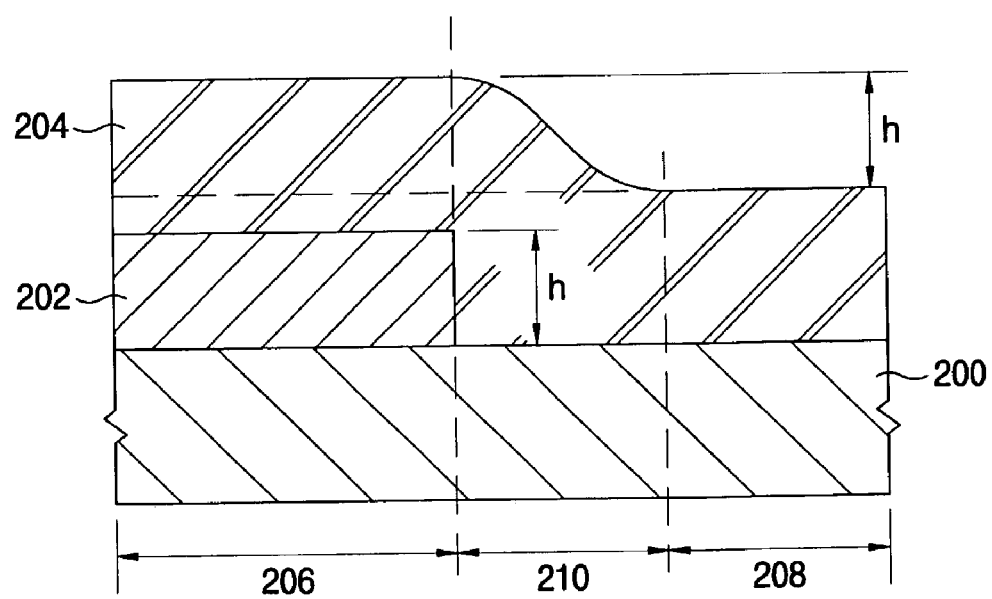

Referring to FIG. 4, an interlayer dielectric film 204 is coated on the pattern 202 and on the semiconductor substrate 200. The height of the interlayer dielectric film 204 is higher than that of the pattern 202. Thus, a boundary portion 210 of the interlayer dielectric film 204 is formed between a first portion 206 of the interlayer dielectric film 204 positioned on the pattern 202 and a second portion 208 of the interlayer dielectric film 204 positioned on the substrate 200 where the pattern 202 is not formed. The first portion 206 is higher than the second portion 208. The boundary portion 210 includes a step (h) generated between the first portion 206 and the second portion 208. The height of the step (h) is substantially identical to the height (h) of the pattern 202.

Figure 5:
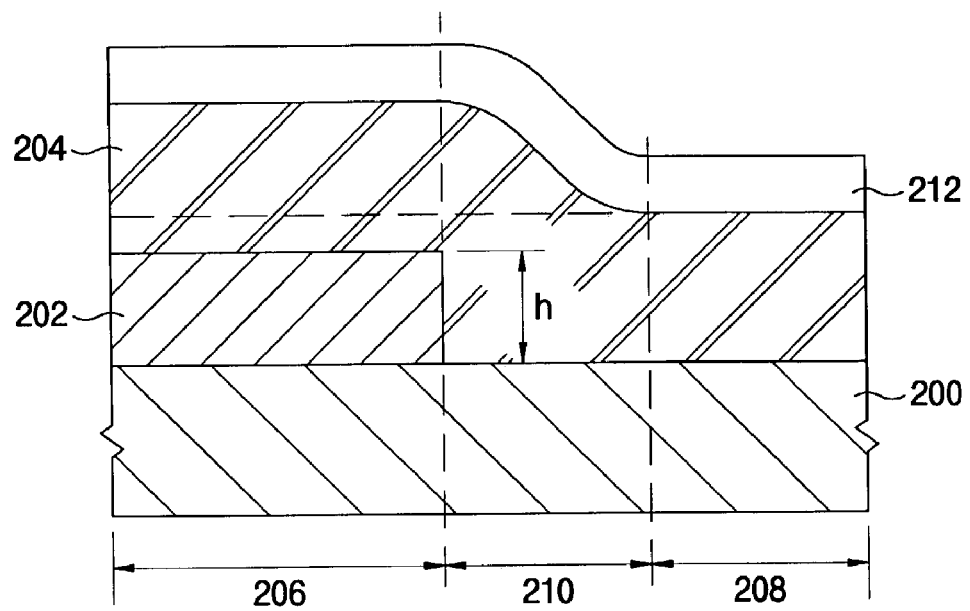

Referring to FIG. 5, a photoresist film 212 is formed on the interlayer dielectric film 204 by coating a photoresist on the interlayer dielectric film 204.

Figure 6:
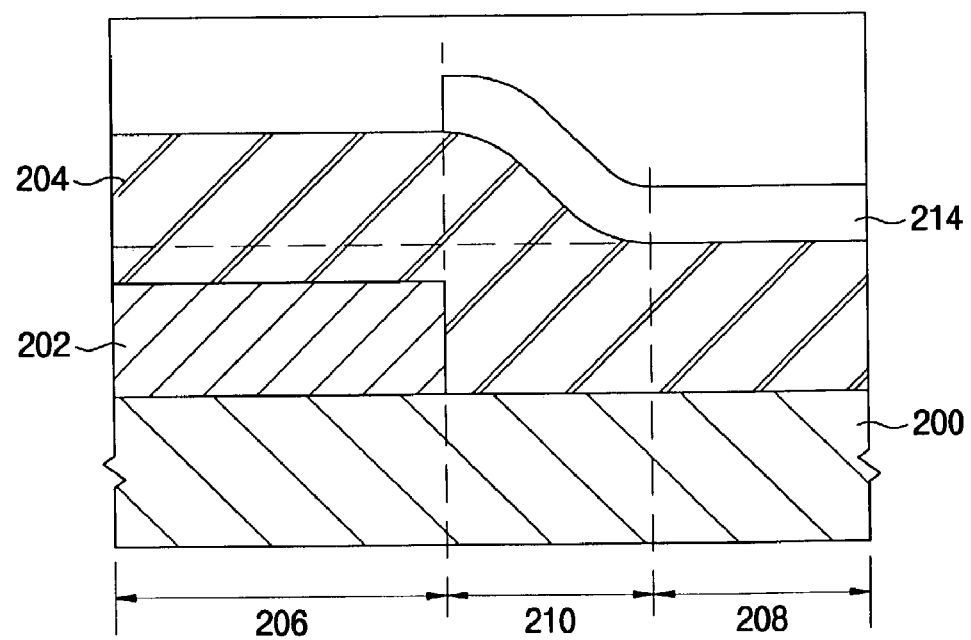

Referring to FIG. 6, the photoresist film 212 is exposed and developed using a photolithography process, thereby forming a photoresist pattern 214 on the interlayer dielectric film 204. The first portion 206 of the interlayer dielectric film 204 is exposed, and the boundary and the second portions 210 and 208 of the interlayer dielectric film 204 are covered with the photoresist pattern 214. The thickness of the photoresist pattern 214 is more than h/n, where h and n are real numbers of one or more. In this case, n represents the etching selectivity of the interlayer dielectric film 204 when the etching selectivity of the photoresist pattern 214 is 1.

Figure 7:
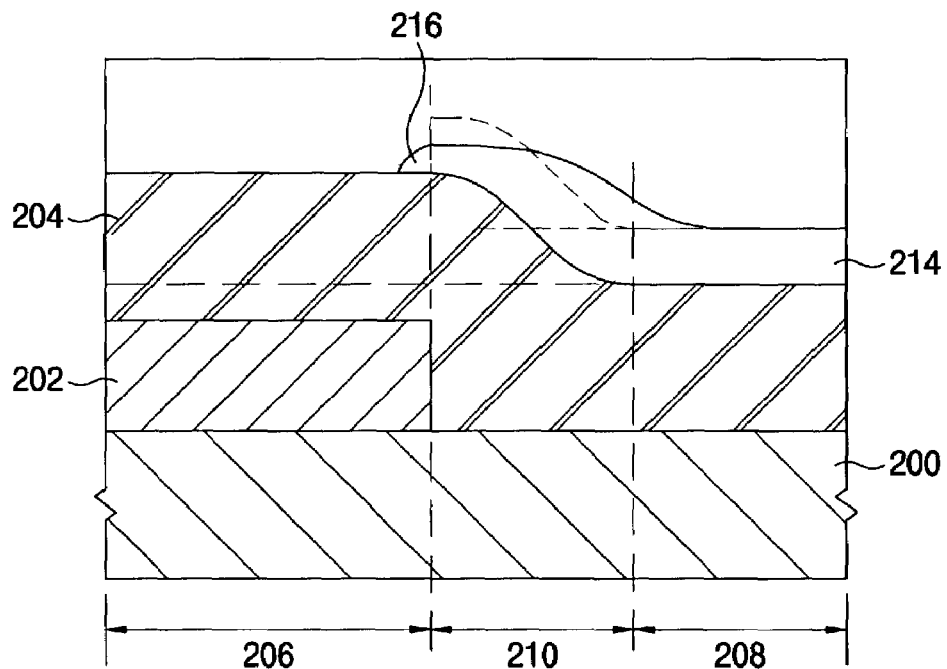

Referring to FIG. 7, the photoresist pattern 214 is re-flowed by a thermal treatment with a photo apparatus or an etching apparatus. With the photo apparatus, the photoresist pattern 214 is thermally treated after developing and post baking the photoresist pattern 214. With the etching apparatus, the photoresist pattern 214 is thermally treated in a heating chamber before an etching process in the etching apparatus.

The photoresist pattern 214 is re-flowed so that a relatively thin portion 216 of the photoresist pattern 214 has a thickness less than the initial thickness of the photoresist pattern 214, h/n. Preferably, the thickness of the relatively thin portion 216 of the photoresist pattern 214 is less than half the initial thickness of the photoresist pattern 214.

Figure 8:
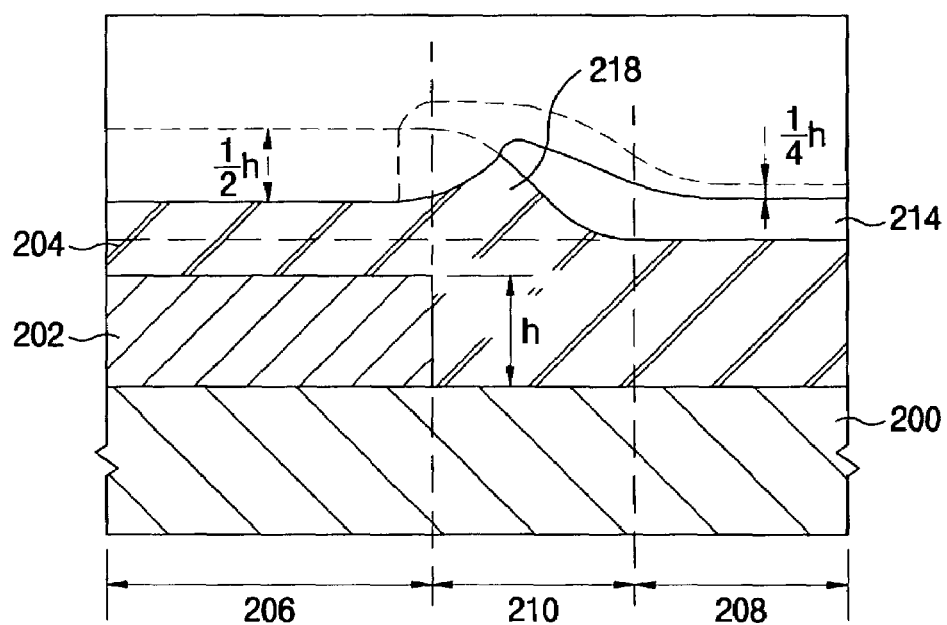

FIG. 8 illustrates a cross-sectional view of the state of the interlayer dielectric film 204 in which the interlayer dielectric film 204 is anisotropically etched to approximately half an initial thickness of the interlayer dielectric film 204 using an etchant having an etching selectivity of about 1:2 between the photoresist pattern 214 and the interlayer dielectric film 204. When the thickness of the photoresist pattern 214 is h/2 and the relatively thin portion 216 of the photoresist pattern 214 has a thickness of less than h/4, an etched portion of the photoresist pattern 214 is etched by a thickness of about h/4, while an etched portion of the interlayer dielectric film 204 is etched by a thickness of about h/2. That is, the height of the etched portion of the photoresist pattern 214 is reduced by about h/4, while the height of the etched portion of the interlayer dielectric film 204 is reduced by about h/2. This is because the etching rate of the interlayer dielectric film 204 is twice as fast as that of the photoresist pattern 214. Hence, the relatively thin portion of the photoresist pattern 214 is removed at the boundary portion 210 of the interlayer dielectric film 204 so that the boundary portion 210 of the interlayer dielectric film 204 is etched. Thus, an edge portion of an essential etching part of the etching process moves from the first portion 206 toward the second portion 208. A pillar 218 of the interlayer dielectric film 204 is formed under the photoresist pattern 214 remaining at the edge portion of the essential etching part of the etching process.

Figure 9:
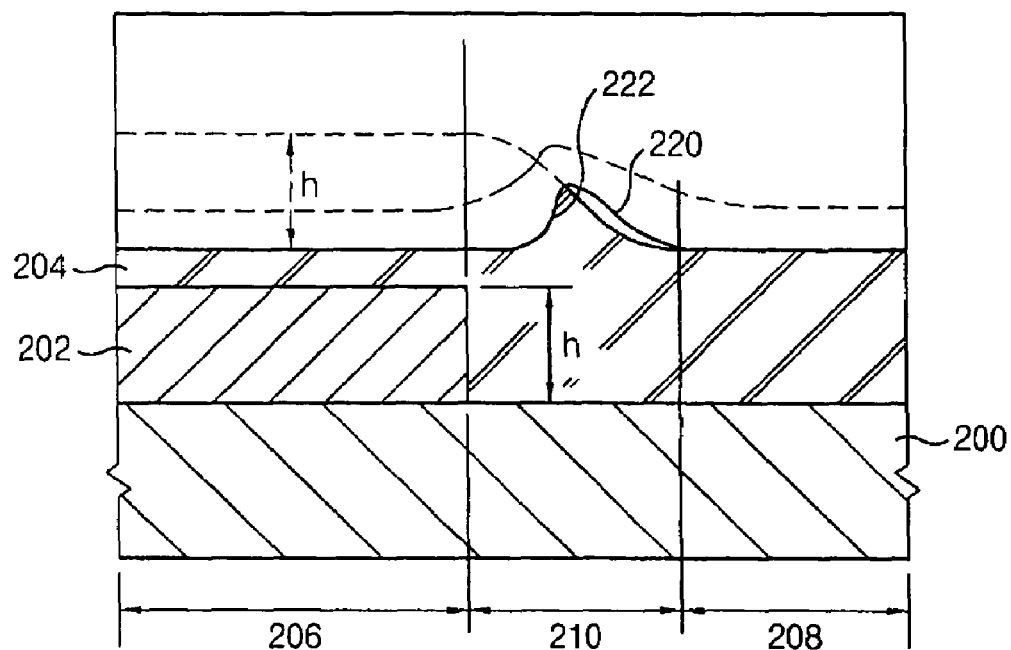

Referring to FIG. 9, when the interlayer dielectric film 204 is removed by a thickness of about h, the height of the first portion 206 is substantially identical to that of the second portion 208, and the photoresist pattern 214 on the second portion 208 is removed. Meanwhile, a residue 220 of the photoresist pattern 214 remains along a slant face of the boundary portion 210 of the interlayer dielectric film 204, and a small protruding portion 222 of the pillar 218 of the interlayer dielectric film 204 is formed under the residue 220.

Figure 10:
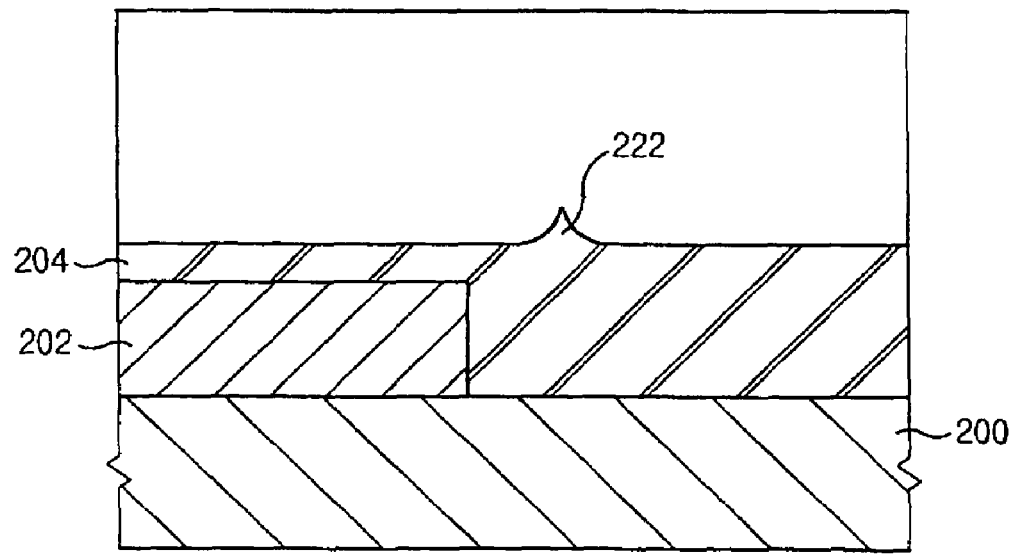

Referring to FIG. 10, the remaining protruding portion 222 of the interlayer dielectric film 204 is removed through a wet etching process or a CMP process in accordance with the size of the protruding portion 222. Hence, the interlayer dielectric film 204 is completely planarized.

In the present invention, the CMP process is used to remove the small protruding portion 222 only, so that the time required for performing the CMP process is greatly reduced. In addition, when the protruding portion 222 is small enough to be sufficiently removed using a wet etching process, the CMP process may be omitted entirely. In such a case, an etch back process may be used instead of the wet etching process to remove the residue 220 and the small protruding portion 222.

Figure 11:
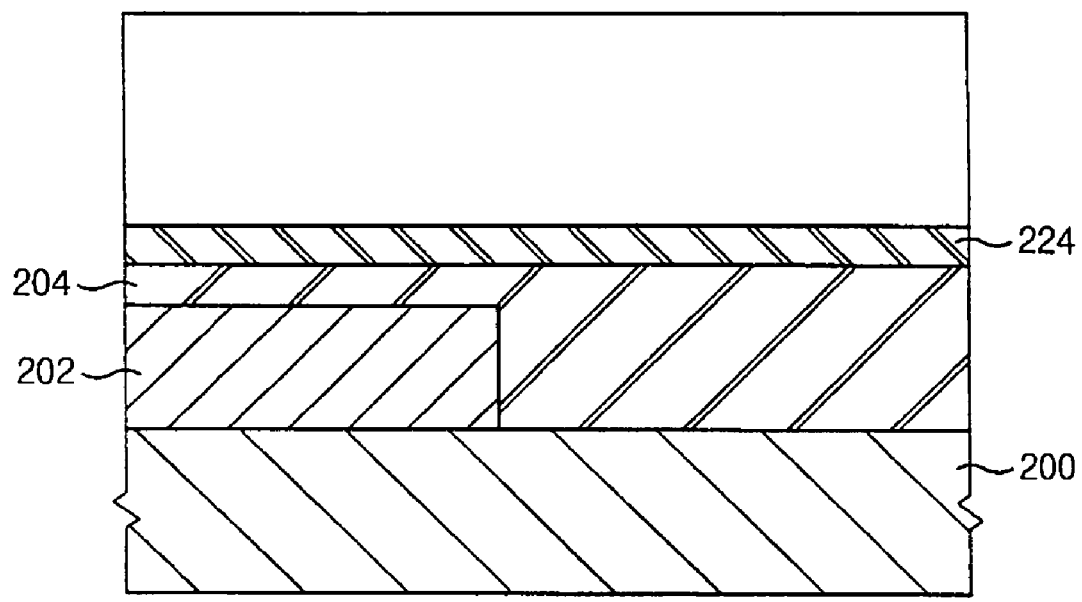

In the meantime, referring to FIG. 11, a supplemental film 224 may be formed on the interlayer dielectric film 204 after the interlayer dielectric film 204 is completely planarized. The supplemental film 224 may be an insulation film, and may include material identical or similar to that of the interlayer dielectric film 204.

According to the present invention, the size of a pillar of an interlayer dielectric film can be minimized by re-flowing a photoresist pattern for etching the interlayer dielectric film during an etching step of a cell open process. Re-flowing the photoresist pattern for etching the interlayer dielectric film in the cell open process allows the thickness of an edge portion of the interlayer dielectric film to be controlled, so that the size of the pillar may be reduced. Because the size of the pillar is minimized, the interlayer dielectric film can be planarized through a simplified process such as a CMP process of short duration, a wet etching process or an etch back process. Therefore, the time and cost for planarizing the interlayer dielectric film may be reduced.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for forming a planarized layer on a semiconductor substrate having concave and convex structures comprising:

forming an interlayer dielectric film on the semiconductor substrate wherein the interlayer dielectric film has concave and convex portions in accordance with the concave and convex structures of the semiconductor substrate;

forming a photoresist pattern on the interlayer dielectric film wherein a portion of the photoresist pattern on the interlayer dielectric film other than the convex portion of the interlayer dielectric film has a thickness of greater than h/n, where h and n are real numbers of one or more, in order to remove the convex portion of the interlayer dielectric film by a depth of approximately h;

re-flowing the photoresist pattern so that the photoresist pattern formed from an edge of the convex portion of the interlayer dielectric film to a slant portion of the interlayer dielectric film between the convex portion and the concave portion has a thickness of below h/n; and etching the interlayer dielectric film by a depth of approximately h using an etchant having an etching selectivity of 1:n between the photoresist pattern and the interlayer dielectric film.

2. The method for forming a planarized layer on a semiconductor substrate having concave and convex structures as claimed in claim 1, wherein the interlayer dielectric film includes BPSG, TEOS, TOSZ or a composite layer thereof.

3. The method for forming a planarized layer on a semiconductor substrate having concave and convex structures as claimed in claim 1, wherein the photoresist pattern is re-flowed using a photo apparatus.

4. The method for forming a planarized layer on a semiconductor substrate having concave and convex structures as claimed in claim 1, wherein the photoresist pattern is re-flowed using an etching apparatus.

5. The method for forming a planarized layer on a semiconductor substrate having concave and convex structures as claimed in claim 1, wherein the interlayer dielectric film has a thickness of approximately 5,000 to 30,000 Å.

6. The method for forming a planarized layer on a semiconductor substrate having concave and convex structures as claimed in claim 1, further comprising:
  removing the photoresist pattern after etching the interlayer dielectric film; and
  removing a pillar of the interlayer dielectric film remaining at the slant portion of the interlayer dielectric film in order to planarize a surface of the interlayer dielectric film.

7. The method for forming a planarized layer on a semiconductor substrate having concave and convex structures as claimed in claim 6, wherein the pillar is removed by a chemical-mechanical polishing process, a wet etching process or an etch-back process.

8. The method for forming a planarized layer on a semiconductor substrate having concave and convex structures as claimed in claim 7, further comprising forming a supplemental film on the interlayer dielectric film after removing the pillar, wherein the supplemental film includes a material identical to that of the interlayer dielectric film.

9. The method for forming a planarized layer on a semiconductor substrate having concave and convex structures as claimed in claim 1, wherein the interlayer dielectric film is anisotropically etched.

10. A method for forming a planarized layer of a semiconductor device formed on a semiconductor substrate including a cell region and a peripheral region wherein the semiconductor substrate includes a capacitor pattern in the cell region having a height greater than a height of the peripheral region, comprising:
  forming an insulation film on the semiconductor substrate having a convex portion, a concave portion and a slant portion between the convex portion and the concave portion;
  forming a photoresist pattern on the insulation film wherein a portion of the photoresist pattern in the cell region and the peripheral region other than on the convex portion of the insulation film has a thickness of greater than h/n, where h and n are real numbers of one or more, in order to remove the convex portion of the insulation film by a depth of approximately h;
  re-flowing the photoresist pattern so that the photoresist pattern formed from an edge of the convex portion of the insulation film to the slant portion of the insulation film between the convex portion and the concave portion of the insulation film has a thickness of below h/n; and
  etching the insulation film by a depth of approximately h using an etchant having an etching selectivity of 1:n between the photoresist pattern and the insulation film.

11. The method for forming a planarized layer of a semiconductor device as claimed in claim 10, wherein the insulation film includes BPSG, TEOS, TOSZ or a composite layer including at least two of BPSG, TEOS and TOSZ.

12. The method for forming a planarized layer of a semiconductor device as claimed in claim 10, wherein the photoresist pattern is re-flowed using a photo apparatus.

13. The method for forming a planarized layer of a semiconductor device as claimed in claim 10, wherein the photoresist pattern is re-flowed using an etching apparatus.

14. The method for forming a planarized layer of a semiconductor device as claimed in claim 10, wherein the insulation film has a thickness of approximately 5,000 to 30,000 Å.

15. The method for forming a planarized layer of a semiconductor device as claimed in claim 10, further comprising:
  removing the photoresist pattern after etching the insulation film; and
  removing a pillar of the insulation film remaining at the slant portion of the insulation film in order to planarize a surface of the insulation film.

16. The method for forming a planarized layer of a semiconductor device as claimed in claim 15, wherein the pillar is removed by a chemical-mechanical polishing process, a wet etching process or an etch-back process.

17. The method for forming a planarized layer of a semiconductor device as claimed in claim 16, further comprising forming an additional insulation film on the insulation film after removing the pillar, wherein the additional insulation film includes a material identical to that of the insulation film.

18. The method for forming a planarized layer of a semiconductor device as claimed in claim 10, wherein the insulation film is anisotropically etched.

* * * * *